(12) United States Patent
Rivero et al.

(10) Patent No.: US 10,510,503 B2
(45) Date of Patent: Dec. 17, 2019

(54) ELECTRICALLY CONTROLLABLE INTEGRATED SWITCH

(71) Applicant: STMicroelectronics (Rousset) SAS, Rousset (FR)

(72) Inventors: Christian Rivero, Rousset (FR); Pascal Fornara, Pourrieres (FR); Antonio di-Giacomo, Rousset (FR); Brice Arrazat, Marignane (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 170 days.

(21) Appl. No.: 14/985,083

(22) Filed: Dec. 30, 2015

(65) Prior Publication Data
US 2016/0107886 A1    Apr. 21, 2016

Related U.S. Application Data

(62) Division of application No. 14/286,331, filed on May 23, 2014, now Pat. No. 9,355,802.

(30) Foreign Application Priority Data

Jun. 6, 2013 (FR) ..................................... 13 55221

(51) Int. Cl.
*H01H 59/00* (2006.01)
*H01L 27/06* (2006.01)
(Continued)

(52) U.S. Cl.
CPC ..... *H01H 59/0009* (2013.01); *B81C 1/00246* (2013.01); *H01H 1/0036* (2013.01);
(Continued)

(58) Field of Classification Search
CPC .......... H01L 23/522; H01H 2001/0078; B81C 2203/0742; B81C 2203/0735;
(Continued)

(56) References Cited

U.S. PATENT DOCUMENTS

| | | |
|---|---|---|
| 6,646,215 B1 | 11/2003 | Nelson |
| 7,339,454 B1 * | 3/2008 | Fleming ................. H01H 61/04 310/306 |

(Continued)

FOREIGN PATENT DOCUMENTS

| | | |
|---|---|---|
| EP | 2154635 A1 | 2/2010 |
| WO | 2005069331 A1 | 7/2005 |

OTHER PUBLICATIONS

French Search Report received in Application No. 1355221 dated Feb. 26, 2014, 8 pages.

(Continued)

*Primary Examiner* — Nilufa Rahim
(74) *Attorney, Agent, or Firm* — Slater Matsil, LLP

(57) ABSTRACT

Methods of forming and operating a switching device are provided. The switching device is formed in an interconnect, the interconnect including a plurality of metallization levels, and has an assembly that includes a beam held by a structure. The beam and structure are located within the same metallization level. Locations of fixing of the structure on the beam are arranged so as to define for the beam a pivot point situated between these fixing locations. The structure is substantially symmetric with respect to the beam and to a plane perpendicular to the beam in the absence of a potential difference. The beam is able to pivot in a first direction in the presence of a first potential difference applied between a first part of the structure and to pivot in a second direction in the presence of a second potential difference applied between a second part of the structure.

20 Claims, 12 Drawing Sheets

(51) Int. Cl.
*H01L 21/822* (2006.01)
*H01H 1/00* (2006.01)
*B81C 1/00* (2006.01)
*H01H 57/00* (2006.01)
*H01L 23/522* (2006.01)

(52) U.S. Cl.
CPC ......... *H01H 57/00* (2013.01); *H01L 21/8221* (2013.01); *H01L 27/0617* (2013.01); *H01L 27/0688* (2013.01); *B81B 2201/018* (2013.01); *B81C 2203/0735* (2013.01); *B81C 2203/0771* (2013.01); *H01H 2001/0068* (2013.01); *H01H 2001/0078* (2013.01); *H01H 2059/0054* (2013.01); *H01L 23/522* (2013.01); *H01L 2924/0002* (2013.01)

(58) Field of Classification Search
CPC ........ B81B 2201/014; B81B 2201/012; B81B 2201/016; B81B 2201/018
USPC .......................................................... 257/415
See application file for complete search history.

(56) References Cited

U.S. PATENT DOCUMENTS

| | | | |
|---|---|---|---|
| 7,657,995 B2 | 2/2010 | Hsu et al. | |
| 7,960,804 B1 | 6/2011 | Ebel et al. | |
| 8,564,387 B1 | 10/2013 | Hammond | |
| 8,604,898 B2 | 12/2013 | Anderson et al. | |
| 8,609,450 B2 | 12/2013 | Gambino et al. | |
| 2005/0146404 A1 | 7/2005 | Yeatman | |
| 2005/0189204 A1 | 9/2005 | Yeatman et al. | |
| 2006/0205106 A1* | 9/2006 | Fukuda | B81C 1/00246 438/52 |
| 2008/0237024 A1* | 10/2008 | Millet | H01H 1/0036 200/600 |
| 2009/0261431 A1* | 10/2009 | Caplet | B81C 1/00944 257/418 |
| 2010/0116632 A1 | 5/2010 | Smith et al. | |
| 2010/0158072 A1 | 6/2010 | Fornara et al. | |
| 2010/0237738 A1* | 9/2010 | Smith | G11C 23/00 310/309 |
| 2011/0117747 A1* | 5/2011 | Wey | B81C 1/00246 438/710 |
| 2012/0009774 A1 | 1/2012 | Fornara et al. | |
| 2012/0280393 A1 | 11/2012 | Kaynak et al. | |
| 2013/0146873 A1 | 6/2013 | Fornara et al. | |
| 2013/0147004 A1 | 6/2013 | Rivero et al. | |
| 2014/0300249 A1 | 10/2014 | Van Kampen et al. | |

OTHER PUBLICATIONS

Kaynak, M. et al., "Characterization of an Embedded RF-MEMS Switch," IEEE, date of conference Jan. 11-13, 2010, 4 pages.
Vayrette, R. et al., "Residual stress estimation in damascene copper interconnects using embedded sensors," Microelectronic Engineering 87 (2010), May 22, 2009, 4 pages.

* cited by examiner

ELECTRICALLY CONTROLLABLE INTEGRATED SWITCH

This application is a divisional of U.S. application Ser. No. 14/286,331, filed on May 23, 2014, which claims the benefit of French Application No. 1355221, filed on Jun. 6, 2013, which application is hereby incorporated herein by reference.

TECHNICAL FIELD

The invention relates to integrated circuits and, in particular embodiments, to switching devices such as breakers or switches, such as electrically activatable switching devices.

BACKGROUND

Currently, the switching devices produced within integrated circuits are generally switches of the electromechanical microsystem (Mechanical Electro Micro System or MEMS) type using elements made, for example, of polysilicon. However, the technology used to produce such switches is a dedicated technology, which is difficult to integrate into a CMOS standard technological flow.

SUMMARY

According to one embodiment, there is proposed a new switching device that can be integrated into all CMOS technological flows through the possible addition of just a few extra operations (the addition of a mask level, for example), doing so without using the conventional technology of MEMS type.

According to one embodiment, there is also proposed a switching device that exhibits a bilateral planar movement and that is almost, or indeed totally, insensitive to temperature variations as well as to stresses generated during its fabrication.

According to one aspect, there is proposed an integrated circuit comprising above a substrate an interconnection part comprising several metallization levels separated by an insulating region. Such an interconnection part is commonly designated by the person skilled in the art under the acronym "BEOL" ("Back End Of the Line").

According to a general characteristic of this aspect, the integrated circuit furthermore comprises, within the interconnection part, an electrically activatable switching device comprising, in a cavity of a housing, at least one assembly including a beam held by a structure built into the housing, the beam and the structure being metallic and situated within one and the same metallization level.

The locations of fixing of the structure on the beam are arranged so as to define for the beam a pivot point situated between these fixing locations.

The structure is substantially symmetric, to within fabrication inaccuracies, with respect to the beam and with respect to a plane perpendicular to the beam, in the absence of a potential difference applied to the structure.

Moreover, the beam is able to pivot in a first direction in the presence of a first potential difference applied between a first part of the structure and to pivot in a second direction in the presence of a second potential difference applied between a second part of the structure.

Such a switching device is thus produced in the so-called BEOL part of the integrated circuits within one and the same metallization level, and therefore exhibits an essentially two-dimensional and metallic structure. It is therefore readily integrated into a CMOS technological flow by making ample use of the conventional production steps for the BEOL part of the integrated circuit.

Moreover, the structure being substantially symmetric, to within fabrication inaccuracies, ideally with respect to a point substantially coinciding with the pivot point, it is almost insensitive or indeed totally insensitive to temperature variations since, in the presence of such temperature variations, the possible expansions or contractions of the structure are distributed symmetrically with respect to the beam, thus giving rise to almost no displacement of this beam.

Initially, the assembly, and in particular the structure, is encapsulated in an insulating material packing the cavity of the housing. After de-encapsulation, that is to say removal of this insulating material, making it possible to release the assembly, the symmetric character of the structure makes it possible to confer an identical geometry on the assembly before and after encapsulation. Moreover, after de-encapsulation, the structure is advantageously stressed in tension in the absence of any potential difference applied to itself. In addition, the tension-stressed character of the structure will favor the pivoting of the beam upon the application of the first or of the second potential difference.

The structure is advantageously X-shaped, the first part of the structure to which the first potential difference is applied comprising a first branch of the X, and the second part of the structure to which the second potential difference is applied comprising the other branch of the X.

According to one embodiment, the assembly of the switching device furthermore comprises, in the housing, at least one abutment situated some distance from the beam in the absence of potential difference applied to the structure and designed to be in contact with the beam upon the application to the structure of one of the two potential differences.

It is then possible to produce a current limiter or else a current intensity detector. As a variant, the assembly of the switching device can furthermore comprise in the housing a first abutment and a second abutment, both situated some distance from the beam in the absence of potential difference applied to the structure. The first abutment is designed to be in contact with the beam upon the application to the structure of the first potential difference, and the second abutment is designed to be in contact with the beam upon the application to the structure of the second potential difference.

With this embodiment, it is then possible to obtain a current limiter or a current intensity detector assigned to two distinct parts of the integrated circuit which would not be in operation simultaneously.

Other embodiments of the assembly are possible.

In the case where at least one wall of the housing comprises an opening, it is particularly advantageous, but not indispensable, especially in order to reduce the risk of degradation of the external environment of the housing, that the integrated circuit furthermore comprises a means, for example a metallic plate, external to the housing, and configured so as to form an obstacle to a diffusion of fluid out of the housing through the opening, typically during the de-encapsulation of the assembly encapsulated in the housing.

In addition, when provision is made for a metallization intended to contact a part of the assembly by passing through an opening made in a wall of the housing, the metallization then advantageously passes through the external means, for example the metallic plate.

BRIEF DESCRIPTION OF THE DRAWINGS

Other advantages and characteristics of the invention will become apparent on examining the detailed description of wholly non-limiting embodiments and of the appended drawings in which.

DETAILED DESCRIPTION OF ILLUSTRATIVE EMBODIMENTS

Figure 1:
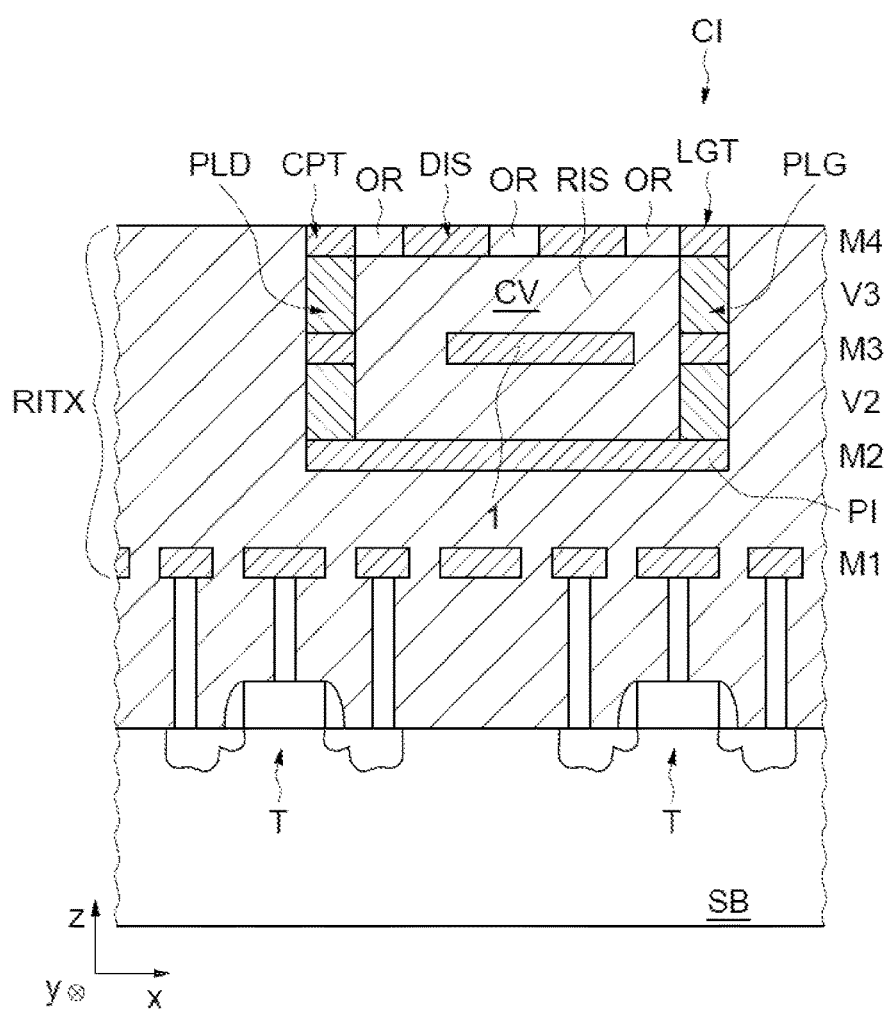
FIG. 1 schematically illustrates an embodiment of an integrated circuit according to the invention.

In FIG. 1, the reference CI designates an integrated circuit within which will be produced a switching device DIS comprising an assembly 1 housed in a cavity CV of a housing LGT.

As will be seen in greater detail hereinafter, the metallic device DIS and the housing LGT are produced within several metallization levels (here three metallization levels M2, M3, M4, and two levels of vias V2, V3) of the interconnection part RITX of the integrated circuit CI, this interconnection part commonly being designated by the person skilled in the art under the acronym BEOL ("Back End Of the Line").

This interconnection part is situated above the substrate SB of the integrated circuit and above the components, such as transistors T, produced in and on the substrate SB.

As is conventional in this respect, some of the metallic tracks produced within the various metallization levels of the integrated circuit are interlinked by interconnection holes or vias, the assembly of these tracks and vias being encapsulated in an insulating region RIS, which can be formed of one or more electrically insulating materials.

The housing LGT comprises especially a lower part PI produced at the metal level M2, a lateral wall PLD produced at the via level V2, at the metal level M3 and at the via level V3, as well as another wall PLG also produced at the via level V2, at the metal level M3 and at the via level V3.

The housing LGT is closed by a holed cap CPT comprising several orifices OR. The cap CPT is produced at the metal level M4.

As will be seen in greater detail hereinafter, the assembly 1 is initially encapsulated in the insulating material RIS of the interconnection part RITX and then, subsequently, after removal of this material RIS from the cavity CV of the housing, released.

Figure 2:
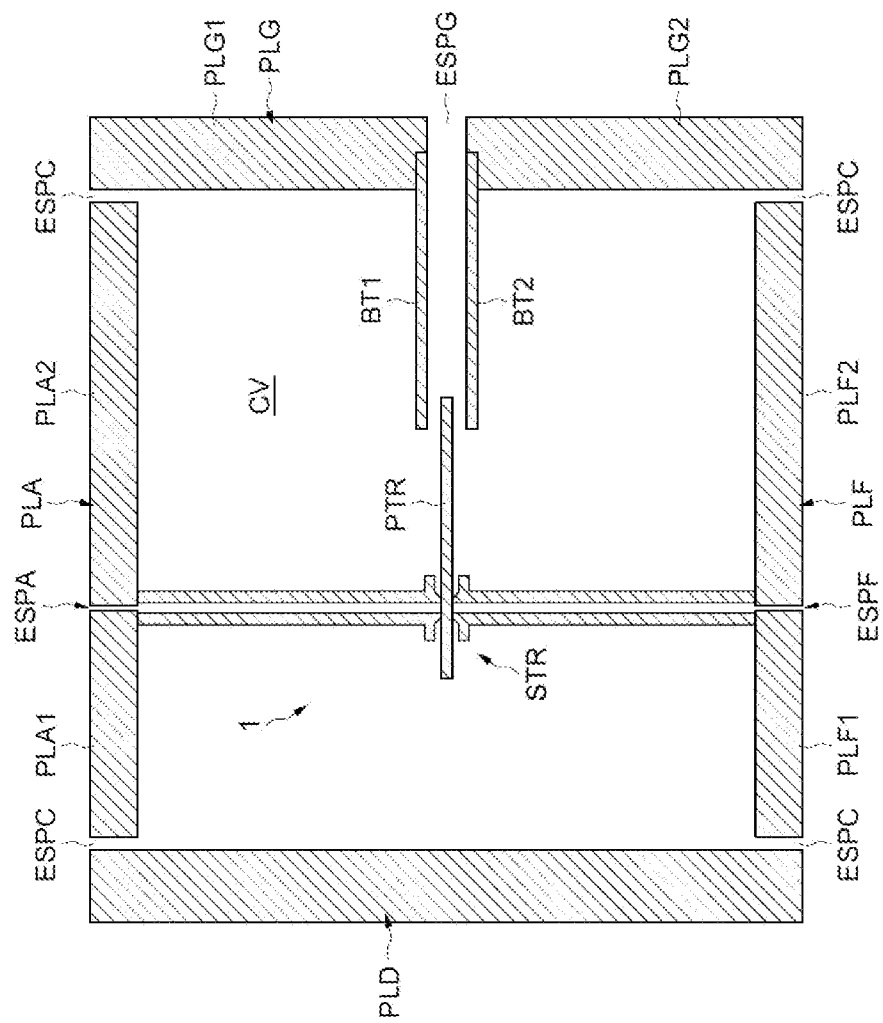
FIG. 2 illustrates in greater detail but still in a schematic manner, an embodiment of an assembly of a switching device according to the invention.

FIG. 2 is a view from above of the metal level 3 illustrating in greater detail an exemplary embodiment of the assembly 1.

The housing LGT comprises, in addition to the wall PLD and the wall PLG, two other walls PLA and PLF. The assembly 1 comprises a structure STR and, here, two fixed abutments or contact regions BT1 and BT2.

The structure STR is here a symmetric X-shaped structure pivotably holding a beam PTR. The structure STR and the beam PTR are produced at the same metallization level, in this instance the metallization level M3.

In FIG. 2, the beam PTR is in a rest state in which its end is some distance from the contact regions BT1 and BT2.

This rest state is obtained, after de-encapsulation of the assembly 1, in the absence of any potential difference applied to the structure STR.

On the other hand, as will be seen in greater detail hereinafter, upon the application of a potential difference to a first part of the structure, typically a first branch of the X, the beam PTR will pivot so as to come into contact with one of the abutments, for example the contact region BT1.

In addition, upon the application of another potential difference to another part of the structure, typically the other branch of the X, the beam PTR will pivot in the other direction so as to come into contact with the contact region BT2.

In order to avoid short-circuits at the level of the walls of the housing upon the application of the various potential differences, the wall PLA comprises two wall pieces PLA1 and PLA2 separated by a space ESPA.

Likewise, the wall PLF comprises two wall pieces PLF1 and PLF2 separated by a space ESPF.

The contact regions BT1 and BT2 are respectively built into two wall pieces PLG1 and PLG2 of the wall PLG, these two wall pieces PLG1 and PLG2 being separated by a space ESPG.

Finally, in this embodiment, the walls PLA, PLG, PLF and PLD are mutually separated by spaces ESPC.

Figure 3:
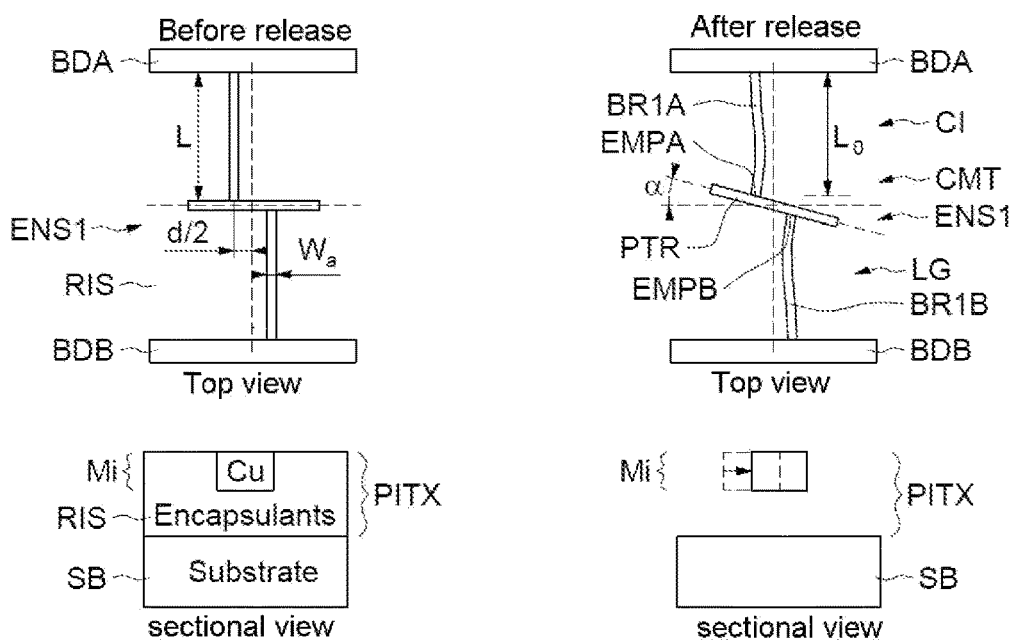
FIG. 3 schematically illustrates an assembly of the prior art housed in a cavity of a housing before and after release of this assembly.

FIG. 3 schematically illustrates a switch CMT of the prior art such as that described in French patent application No. 1161407. (The U.S. counterpart is published as U.S. publication no. 2013/0146873.) This structure will be referred to before returning in detail to the structure and the manner of operation of the device DIS of FIG. 2.

The switch CMT here comprises an assembly ENS1 in the form of an asymmetric cross. This assembly ENS1 comprises a first arm BR1A and a second arm BR1B built into a beam PTR, also dubbed "central pointer", at two locations EMPA and EMPB respectively situated on two opposite faces of the beam PTR. These two locations EMPA and EMPB are spaced a distance d apart.

The left part of FIG. 3 shows the switch CMT, and more particularly the assembly ENS1 encapsulated in an insulating region RIS while the right part of FIG. 3 shows the same assembly after etching of the insulating region so as to release the arms BR1A and BR1B as well as the beam PTR.

The assembly ENS1, thus released, therefore extends inside a housing LG resulting from the removal of the insulating region RIS, the two arms BR1A and BR1B being built into the edges BDA and BDB of the housing.

After de-encapsulation of an assembly of this type, there is a relaxation of the stresses, thereby bringing about a residual longitudinal deformation of the arms bringing about a deviation a of the pointer, here clockwise.

More precisely, if one assumes an arm of constant width Wa, the deviation a is expressed by the following formula:

$$a = \frac{d \cdot L \cdot L_0 (L - L_0)}{d^2(2L - L_0) + \frac{4}{3} \cdot W_a^2 \cdot L_0}$$

where L0 is the length of the arm after relaxation
L0 is equal to $$\frac{L}{1 + \frac{\sigma}{E}}$$

where σ designates the residual mean longitudinal stress and E the Young's modulus of the material (equal to about 130 GPa for isotropic copper).

The residual mean longitudinal stress σ is determined experimentally on the basis of measurements performed on test structures exhibiting diverse values of d and diverse values of Wa. Thus, for 1/d equal to 2 µm−1 and Wa equal to 0.5 µm, σ equals about 800 MPa.

By way of indication, for arms 10 microns in length and 0.2 microns in width, the deviation of the pointer is of the order of 0.2 microns for a spacing d of 2 microns. For a spacing of 1 micron, the deviation a is of the order of 0.3 microns. This is understood for switches annealed at 400° with an insulating region RIS of 0.56 microns.

For a line width (arm width) of the order of 0.2 microns, a mean longitudinal residual deformation of between 0.25% and 0.30% is obtained for a line width (width of the arms) of 0.5 microns, 0.20% for a line width of 1 micron, and a little less than 0.20% for a line width of 2 microns.

This displacement a of the pointer is a parameter which must be taken into account when placing abutments, if any, in the housing.

On the other hand, in the embodiments of the invention, having regard to the fact that the structure STR is a symmetric structure, there is no deviation of the beam PTR during the de-encapsulation of the assembly 1 and the configuration illustrated in FIG. 3 is the same before and after release of the assembly 1 in the cavity CV of the housing LGT. This facilitates the definition of the location of the abutments in the cavity in relation to the beam PTR. Stated otherwise the stresses generated during the fabrication of the device are circumvented here and the assembly remains almost or indeed totally invariant whatever the stresses generated in the course of the fabrication method.

Furthermore, since there is no displacement of the beam PTR during the release of the assembly 1, there is no relaxation of the stresses in the structure STR and the latter is then stressed in tension after release of the assembly 1. In addition, it will be seen that these tensile stresses will facilitate the pivoting of the beam upon the application of a potential difference to the structure STR.

Figure 4:
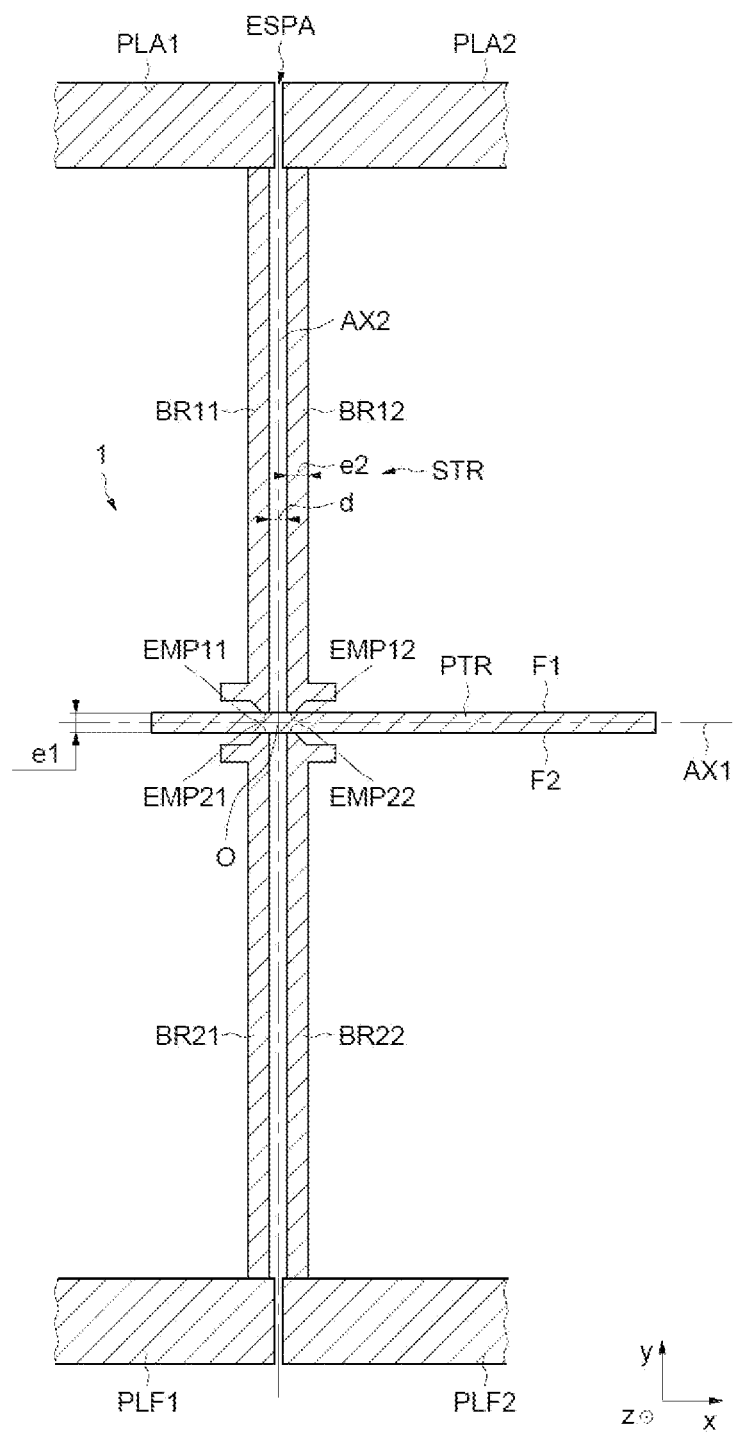
FIGS. 4 to 16 relate to various embodiments of an integrated circuit according to the invention.

Reference is now made more particularly to FIG. 4 to describe in greater detail the characteristics of the assembly 1 and especially those of the structure STR.

This structure STR here comprises a first pair of first arms BR11, BR12. These arms BR11 and BR12 are, as indicated hereinabove, stressed in tension. They therefore behave after release of the assembly 1 like springs under tension. They are moreover built into a first edge of the housing, in this instance the wall PLA. More precisely, the arm BR11 is built into the wall piece PLA1 and the arm BR12 is built into the wall piece PLA2.

The structure STR also comprises a second pair of second arms BR21 and BR22. By analogy these two arms BR21 and BR22 are stressed in tension and are built into a second edge of the housing, in this instance the wall PLF.

More precisely, the second arm BR21 is built into the wall piece PLF1 and the second arm BR22 is built into the wall piece PLF2.

The two first arms BR11 and BR12 are fixed by their other end on a first face F1 of the beam PTR at two first fixing locations EMP11 and EMP12.

Likewise, the two second arms BR21 and BR22 are fixed by their other end, on a second face F2 of the beam, opposite from the face F1, at two second fixing locations EMP21 and EMP22.

The fixing locations EMP11, EMP12, EMP21 and EMP22 are arranged so as to define for the beam a pivot point O which, when the structure is perfectly symmetric with respect to the axes Ax1 and Ax2, is situated in the middle of the locations EMP11, EMP12, EMP21, EMP22. In this case, the pivot point O forms a point of symmetry for the structure STR.

Thus, by way of indication, the distance d reckoned along the axis Ax1 between the arms BR11 and BR12 and between the arms BR21 and BR22 is typically of the order of a micrometer. The width e2 of the arms is for example of the order of a micrometer and the width e1 of the beam, reckoned along the axis Ax2, is for example of the order of a micrometer.

So as to further favor the pivoting of the beam, those ends of the arms that are fixed on the beam are advantageously beveled.

Figure 5:
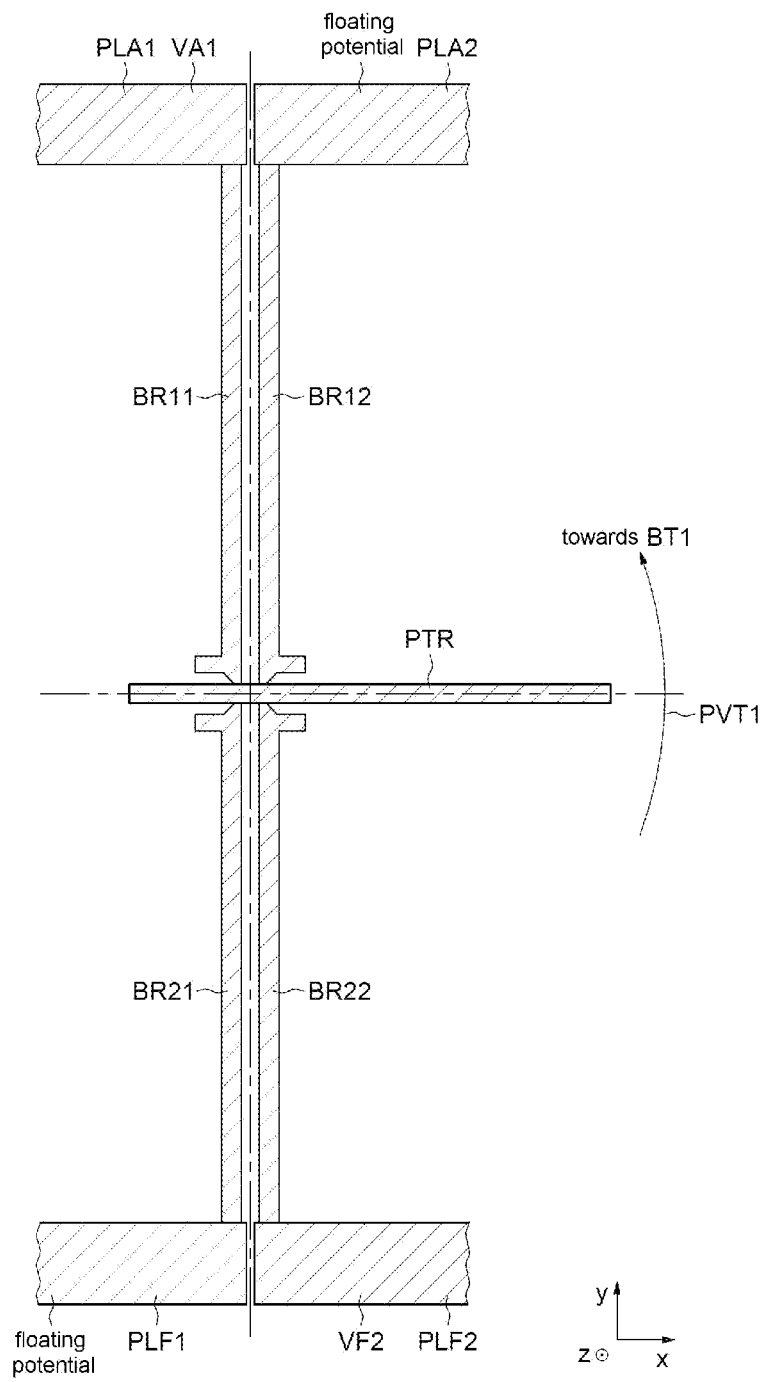

Reference is now made more particularly to FIG. 5 to illustrate a first case of operation of the device. In FIG. 5, a potential VA1 is applied to the wall piece PLA1 and a potential VF2 to the wall piece PLF2 while the potentials of the wall pieces PLA2 and PLF1 are left floating.

By way of indication, it is for example possible to apply a voltage VA1 of up to a few volts and a zero voltage VF2 (ground).

Therefore, a current flows in the arm BR11 and in the arm BR22. This consequently results, through the Joule effect, in an increase in the temperature of the arms BR11 and BR22. This temperature increase will initially help to relax the tensile stresses in the arms BR11 and BR22. In addition, since the arms BR12 and BR21 are stressed in tension, they will have a tendency to pull the beam towards the walls PLA2 and PLF1, so bringing about a pivoting PVT1 of the beam around its pivot point towards the abutment BT1.

Next, after relaxation of the tensile stresses in the arms BR11 and BR22, the heating of these arms will lead to an expansion of the latter, so helping with the pivoting PVT1.

With values of the order of a micrometer for the above-mentioned parameters d, e1 and e2, an arm length of the order of 25 micrometers, a beam length of the order of 30 micrometers and a voltage difference VA1-VF2 of 118 mV, the current flowing in the arms BR11 and BR22 is of the order of 54 mA and leads to a displacement of the end of the beam of the order of 240 nm.

Figure 6:
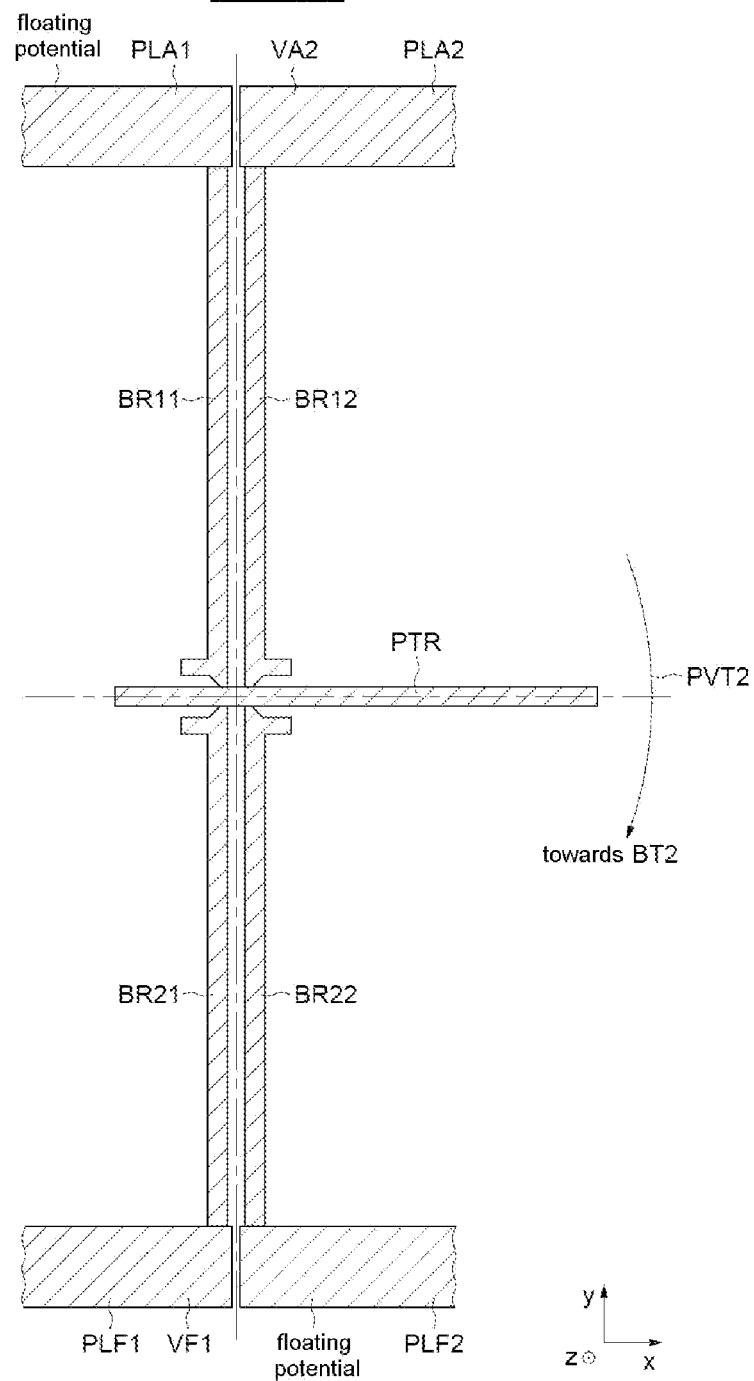

In the case where, as illustrated in FIG. 6, this time a potential difference VA2 minus VF1 is applied between the wall pieces PLA2 and PLF1, while leaving a floating potential on the wall pieces PLA1 and PLF2, this time a current is made to flow in the arms BR12 and BR21, this time bringing about a pivoting PVT2 in the reverse direction, that is to say towards the abutment BT2.

The explanation detailed hereinabove relating to the pivoting PVT1 of the beam PTR applies of course by analogy for the pivoting PVT2.

This assembly 1 therefore allows a movement in the bilateral plane XY.

A possible application of the invention can consist of a current limiter. Indeed, if the wall piece PLG1 is grounded, and in the case of FIG. 5, where a portion of the integrated circuit is connected between the wall pieces PLA1 and PLF2, the current flowing in the arms BR11 and BR22 originating from this portion of integrated circuit, can then, if it exceeds a certain threshold, cause the beam to pivot towards the abutment (contact region) BT1. In addition, when the beam PT1 comes into contact with the abutment BT1, a part of the current exits through the abutment BT1 and the wall PLG towards ground, thereby de facto limiting the current flowing in the arms BR11 and BR22, and consequently in the corresponding portion of integrated circuit.

It is also possible to limit the current in another portion of integrated circuit not operating simultaneously with the first portion of integrated circuit, by this time connecting this other portion to the wall pieces PLA2 and PLF1. The limitation of the current will then be effected via the abutment BT2.

Figure 7:
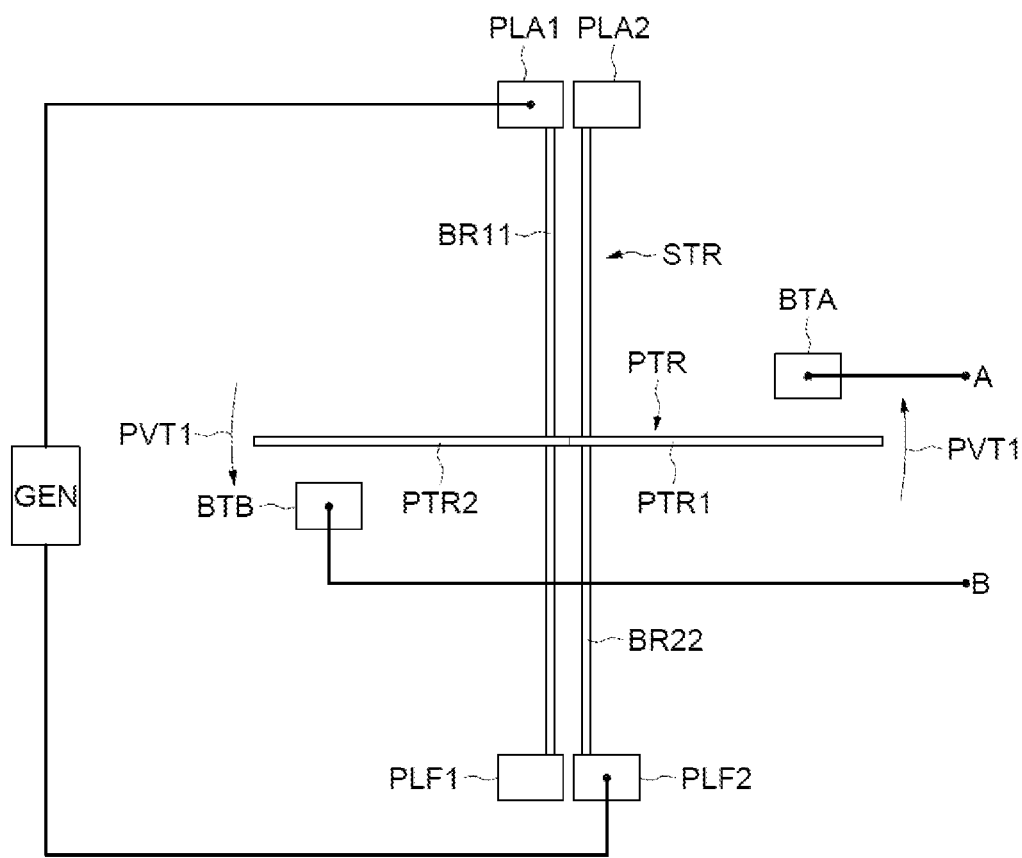

FIG. 7 illustrates another embodiment of the assembly 1. In this embodiment, the beam PTR is symmetric with respect to the structure and comprises two beam pieces PTR1 and PTR2. Two abutments BTA and BTB are respectively disposed facing and some distance from the ends of the beam pieces PTR1 and PTR2. Conventional means GEN, known per se, are able to cause an electric current to flow in the arms BR11 and BR22 so as to bring about the pivoting of the beam PTR towards the abutments BTA and BTB, thereby making it possible to establish an electrical link between the points A and B. Thus, in this embodiment, the device is a switch which is in a state which normally open ("normally off") in the rest state, and in a closed state ("on") upon the application of a potential difference between the wall pieces PLA1 and PLF2, thereby making it possible to establish an electrical link between the points A and B.

It will be appropriate to note here that a sufficiently high impedance will preferably be chosen for the circuit A-B so as to force the current to pass through the arms BR11 and BR12 even when the ends of the beams PTR1 and PTR2 are in contact with the abutments BTA and BTB.

Figure 8:
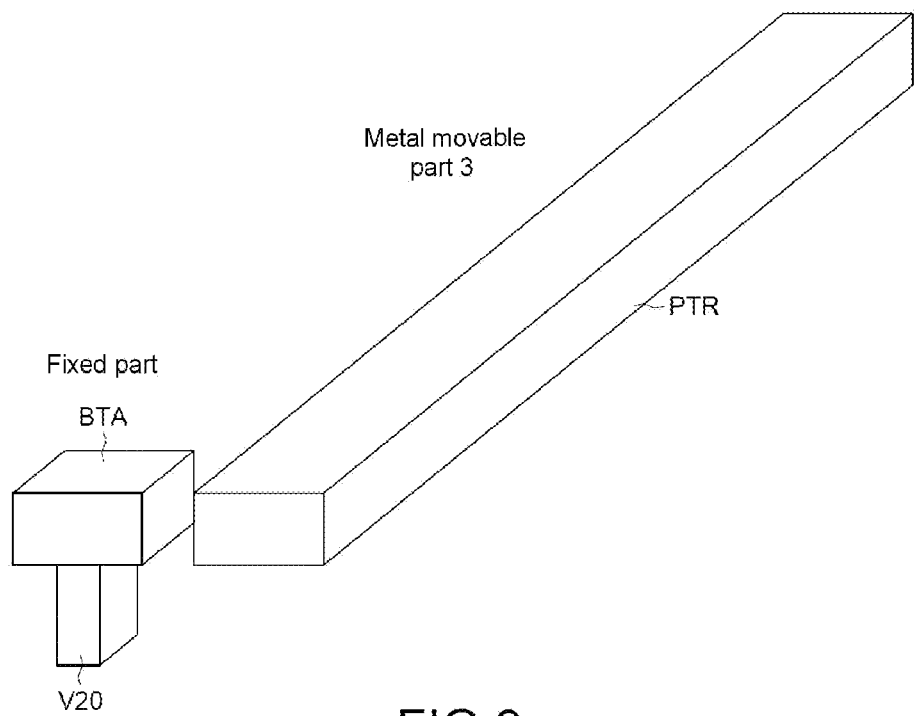

It is also appropriate to note that if, in the embodiments of FIGS. 4, 5 and 6, the abutments BT1 and BT2 were built directly into a wall of the housing, it is possible, in the embodiment of FIG. 7, that these abutments are held fixed in the housing by vias, as illustrated for example in FIG. 8, linking this abutment BTA to a lower metallization by a via V20.

Figure 9:
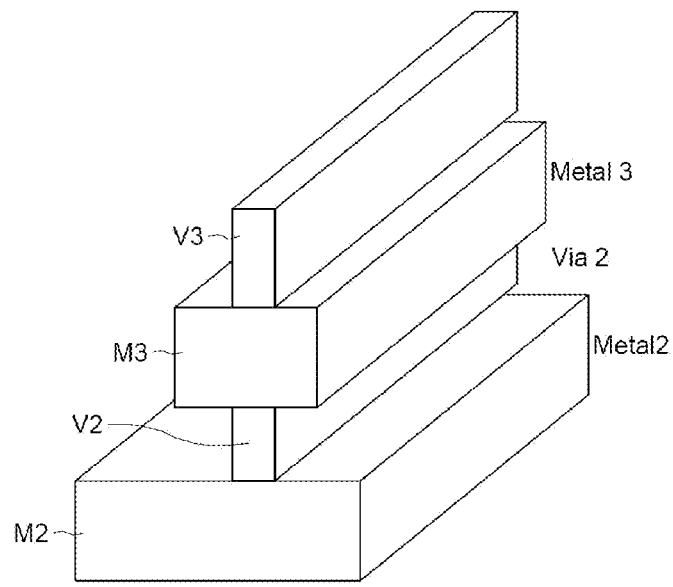
Figure 10:
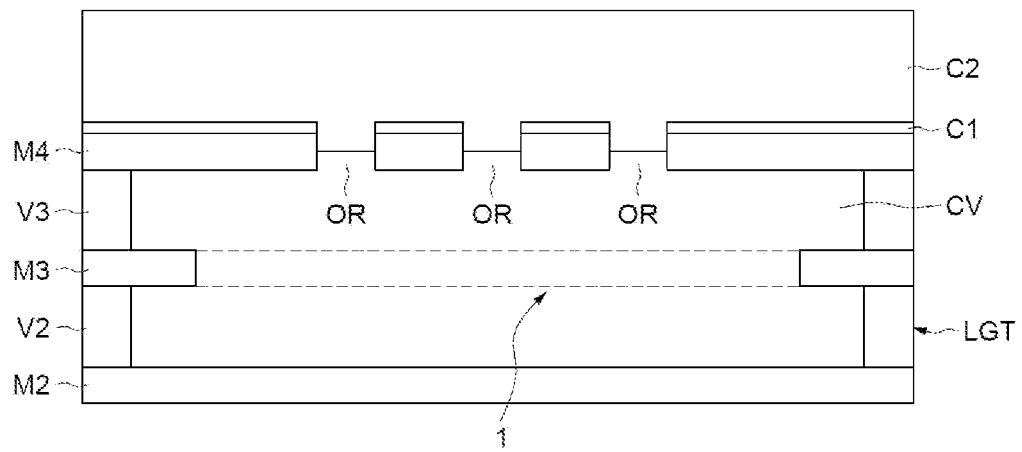

Reference is now made more particularly to FIGS. 9 and 10 to illustrate a mode of fabrication of an exemplary embodiment of a device according to the invention. It is assumed in these figures that the assembly, as well as the abutments, are produced at the metallization level M3 (Metal 3).

It is then seen (FIG. 9) that use is made of the level V2 of vias 2 between the metal level 2 and the metal level 3 and the level V3 of vias 3 between the metal 3 and the metal 4 to form the lateral walls of the housing and form a "protection" wall for the oxide etching which will follow and allow the de-encapsulation of the assembly and various abutments.

Moreover, the structure STR and the beam of the switch and also the fixed part, in this instance the abutment or abutments, are produced at the level of the metal 3.

The switch DIS, and especially the assembly are produced by using conventional steps for metallization level and vias fabrication. More precisely, as illustrated in FIG. 9, after making the metal level M2 and via level V2, the assembly, represented here dashed for the sake of simplification, is produced in a conventional manner by etching the underlying oxide and depositing metal, in this instance copper, in the trenches. Next, the assembly is covered with oxide and the metallization level M4 is produced thereafter.

After formation of a conventional nitride layer C1 on the metal level 4, a comb is made in this metal level 4 so as to form the orifices OR of the cap CPT.

Next, an isotropic dry etching is undertaken followed for example by a wet etching for example with hydrofluoric acid, so as to eliminate the insulating region (oxide) encapsulating the assembly as well as the various abutments and thereby produce the cavity of the housing LGT.

Next, a non-compliant oxide deposition is undertaken so as to form a layer C2 plugging the orifices OR.

Of course, what has just been described for the metal levels M2, M3, M4 can be generalized to the metal levels $M_i-1$, $M_i$, $M_{i+1}$.

The conventional method for producing the various higher metallization levels is continued thereafter.

Figure 11:
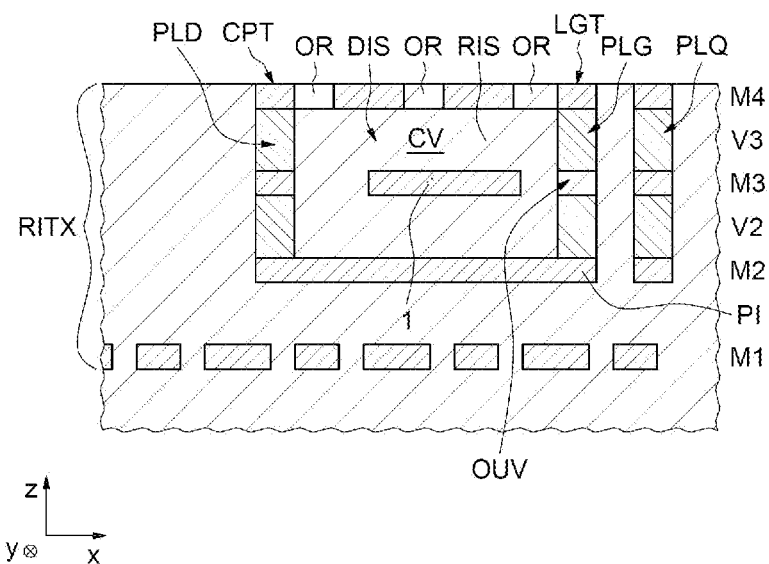

In certain embodiments, such as for example those illustrated in FIGS. 4 to 6, at least one of the walls of the housing can comprise an opening. In this case, and although not indispensable, it is particularly advantageous, as illustrated in FIG. 11 in which for the sake of simplification only the interconnection part RITX (BEOL) of the integrated circuit has been represented, to make provision, facing the opening OUV of a wall, for example the wall PLG of the housing LGT, for a means, here a plate PLQ, external to the housing LGT and configured so as to form an obstacle to a diffusion of fluid, especially the de-encapsulation fluid, out of the housing through the opening OUV. This makes it possible to limit the diffusion of the de-encapsulation fluid out of the housing so as to minimize the risk of this fluid degrading other parts of the integrated circuit, such as for example transistors produced in the exterior and interior vicinity of the housing.

Figure 12:
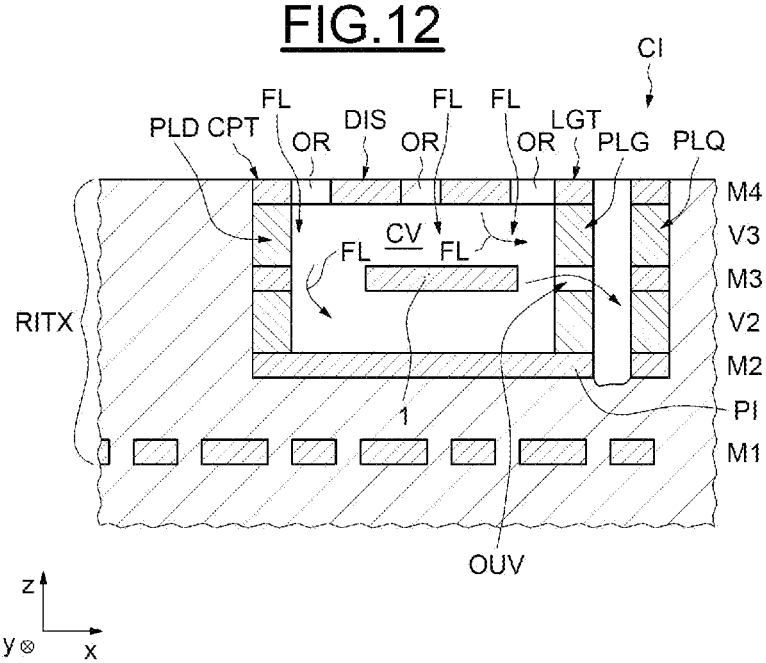

In the embodiment of FIG. 11, the plate is produced at the metallization levels M2, M3 and M4 and at the levels of vias V2, V3. The space between the opening OUV and the plate PLQ can for example vary between 0.12 and 1 micron while the thickness of the plate, reckoned in the X direction, can vary between 0.2 and 1 micron. Thus, as illustrated in FIG. 12, the de-encapsulation fluid FL penetrates into the housing through the orifices OR of the cap found CPT and the fluid also propagates outside of the housing LGT through the opening OUV so as to remove the insulating material RIS disposed between the wall PLG and the plate PLQ. On the other hand, the diffusion of the fluid out of the housing through the opening OUV is impeded by the plate PLQ.

Figure 13:
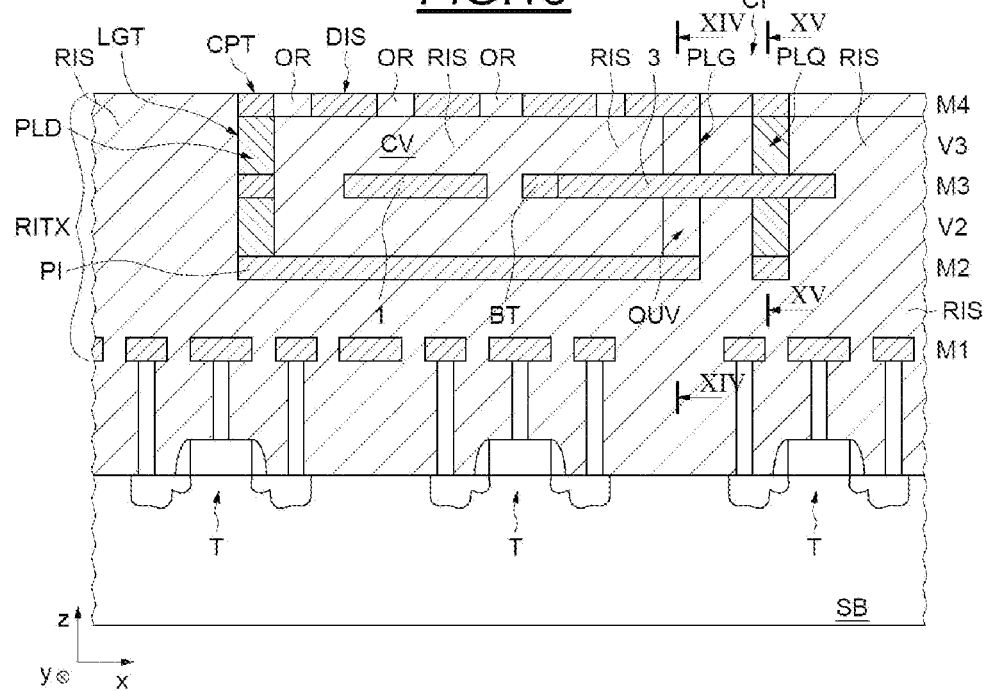

It is however possible, as illustrated in FIG. 13, that in an embodiment, provision is made for a metallization 3 passing through an opening OUV made in a wall of the housing LGT, for example the wall PLG, so as to contact an abutment BT and convey an electrical signal.

Figure 14:
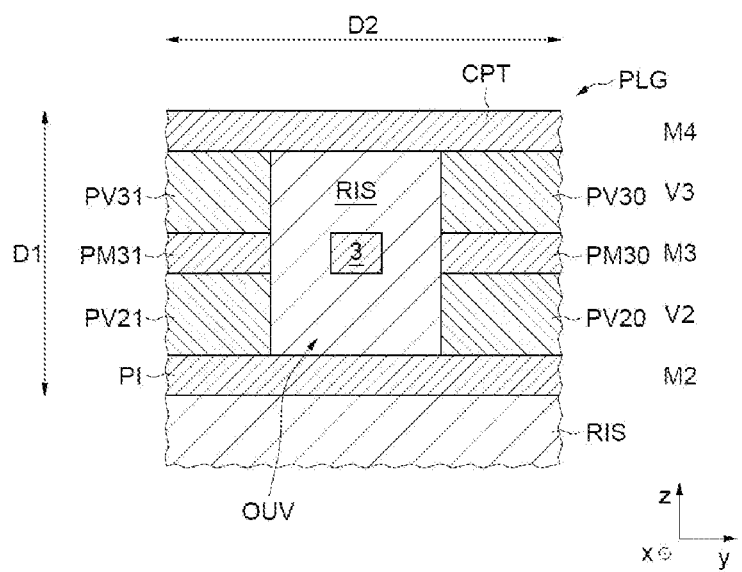

As illustrated in FIG. 14 which is a section cut on the line IV-IV of FIG. 13, the wall PLG in which the opening OUV is made extends, just like the wall PLD, over the three metallization levels M2, M3 and M4 and the two levels of vias V2 and V3.

The opening OUV is delimited in the direction D1 (vertical direction) by a first portion of the wall PLG situated at the upper metallization level, in this instance a part of the cap CPT, and by a second wall portion situated at the lower metallization level (the metal level M2) formed here by a portion of the floor wall PI.

The opening OUV is delimited in a second direction perpendicular to the first direction (in this instance the horizontal direction) by a third and a fourth wall portion extending opposite one another on the intermediate metallization level M3 and on the two levels of vias V2 and V3 flanking this intermediate metallization level.

More precisely, the third wall portion comprises a portion PV20 situated at the via level V2 surmounted by a portion of metallic track PM30 surmounted by another portion PV30 situated at the via level V3.

Likewise, the fourth wall portion comprises a portion PV21 situated at the via level V2 surmounted by another portion of metallic track PM31 surmounted by a portion PV31 situated at the via level V3.

In addition, the through metallization 3 extends at the metallization level M3 while being some distance from the metallic portions PM30 and PM31, that is to say while being electrically insulated from the wall PLG.

Here again the integrated circuit CI comprises a metallic plate PLQ (FIG. 13 and FIG. 15) built into the metallization 3. This plate PLQ is disposed facing the opening OUV and consequently here extends over the three metallization levels M2, M3, M4 and the two levels of vias V2, V3. That said, this plate could also overhang the opening and consequently extend over additional metallization levels and additional levels of vias.

Figure 15:
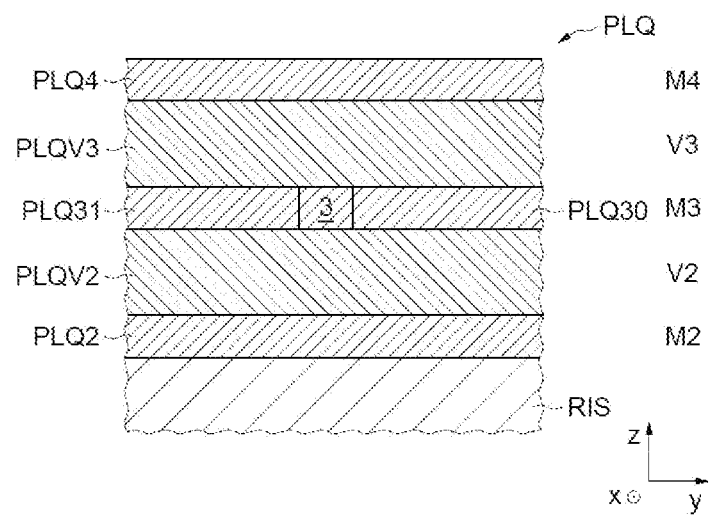

More precisely, as illustrated in FIG. 15 which is a section cut on the line XV-XV of FIG. 13, the plate PLQ comprises a lower metallic portion PLQ2 produced at the metal level M2, a portion PLQV2 produced at the via level V2, two metallic portions PLQ30 and PLQ31, produced at the metallization level M3 and flanking the metallization 3. In practice, the metallization 3 and the portions PLQ30 and PLQ31 form one and the same metallic part.

The plate PLQ furthermore comprises a metallic portion PLQV3 produced at the via level V3 and finally a metallic portion PLQ4 produced at the metal level M4.

The plate PLQ is some distance from the opening OUV, so as not to short-circuit the metallization M3 with the floor wall PI and the cap CPT.

In fact, the plate PLQ of FIG. 15 is analogous to the plate PLQ of FIG. 11 except for the difference that it is traversed by the metallization 3.

Figure 16:
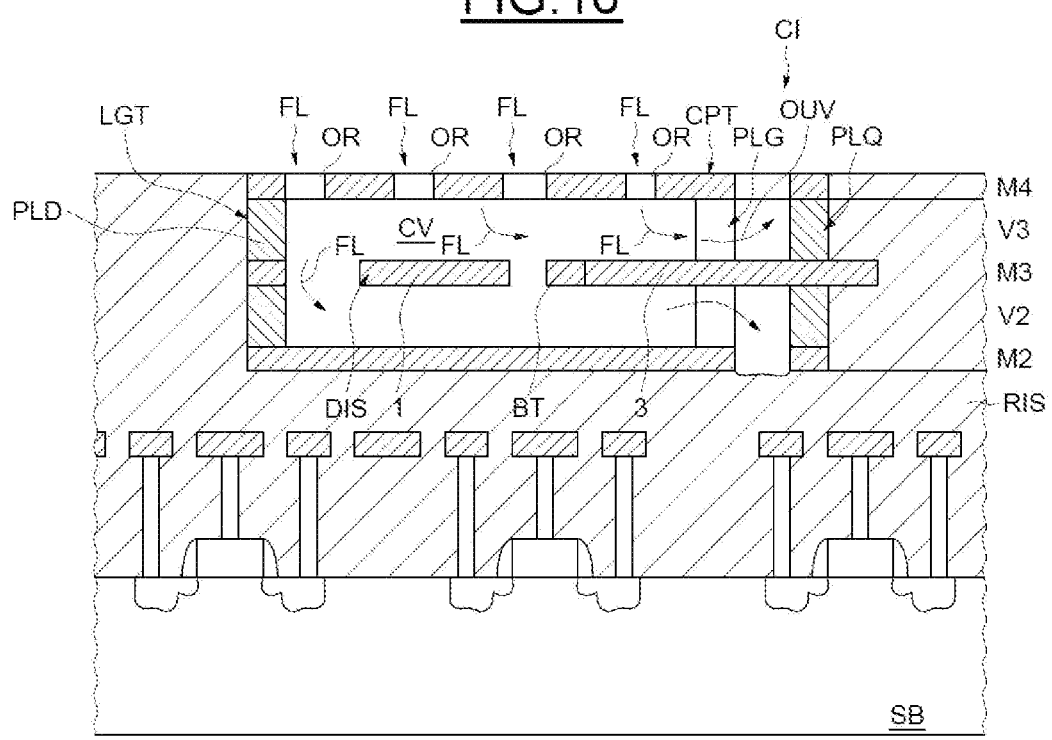

In addition, in a manner analogous to what has been described hereinabove with reference to FIG. 13, during the de-encapsulation of the assembly 1 of the abutment BT and of the metallization 3, the de-encapsulation fluid FL also propagates outside of the housing LGT through the opening OUV so as to remove the insulating material RIS disposed between the wall PLG and the plate PLQ but its diffusion is impeded by the plate PLQ (FIG. 16).

Of course, the external means may be different from a plate and may be for example a tunnel built into the wall PLG around the opening OUV as described in French patent application No. 13 50 161 (and U.S. counterpart application Ser. No. 14/148,884).

What is claimed is:

1. A method of forming an integrated circuit chip with a switching device, the method comprising:
   providing a semiconductor substrate;
   forming back-end-of-line metallization over the semiconductor substrate, the back-end-of-line metallization including a plurality of levels of metal, each level of metal extending in a respective plane parallel to and spaced from an upper surface of the semiconductor substrate; and
   forming the switching device within a cavity in the back-end-of-line metallization, the switching device comprising a beam held by a structure at a pivot point and a contact device extending into the cavity adjacent to the beam, wherein:
   the beam, the structure and the contact device are formed from a same level of metal of the plurality of levels of metal,
   the switching device is enclosed in a housing,
   the contact device is built into a sidewall of the housing,
   the structure comprises a first arm, a second arm, a third arm, and a fourth arm, the first arm and the second arm are disposed on a first side of the beam, and the third arm and the fourth arm are disposed on a second side of the beam, the first side of the beam being opposite to the second side of the beam,
   the first arm is aligned with the third arm, and the second arm is aligned with the fourth arm,
   the first arm is electrically connected to the fourth arm, and the second arm is electrically connected to the third arm, and
   the beam is configured to pivot in a first direction when a first voltage is applied to the first arm and a second voltage is applied to the fourth arm, and the beam is configured to pivot in a second direction when a third voltage is applied to the second arm and a fourth voltage is applied to the third arm.

2. The method according to claim 1, wherein forming the switching device within the cavity comprises:
   forming the housing from metal layers of the plurality of levels of metal and via layers of the back-end-of-line metallization, the housing enclosing the cavity and including an opening; and
   removing dielectric material from within the housing, wherein the dielectric material is removed by using an etchant introduced via the opening.

3. The method according to claim 2, wherein a barrier region is disposed outside the housing and serves as an obstacle to prevent the etchant from diffusing out of the housing through the opening while removing the dielectric material.

4. The method according to claim 2, wherein at least one wall of the housing comprises a through opening via through which an electrical contact is made to the structure, and wherein a barrier region disposed outside the housing serves as an obstacle to prevent the etchant from diffusing out of the housing through the through opening while removing the dielectric material.

5. The method according to claim 2, wherein:
   the housing and the switching device are produced within a first metal layer of the plurality of levels of metal, a second metal layer of the plurality of levels of metal, a third metal layer of the plurality of levels of metal, a first via layer of the via layers of the back-end-of-line metallization, and a second via layer of the via layers of the back-end-of-line metallization and
   wherein the cavity is defined in part by a first conductive feature of the first metal layer, a first via of the first via layer, and a second via of the first via layer, and wherein the first conductive feature extends from the first via to the second via, and the first conductive feature contacts each of the first via and the second via.

6. The method according to claim 1, further comprising forming a plurality of transistors in the semiconductor substrate prior to forming the back-end-of-line metallization, wherein forming the back-end-of-line metallization comprises connecting the plurality of transistors into a circuit.

7. The method according to claim 1, wherein the structure is X-shaped and substantially symmetrical with respect to the beam.

8. The method according claim 1, wherein the structure is stressed in tension in the absence of a potential difference applied to the structure.

9. A method, comprising:
   forming an interconnect region over a semiconductor substrate, the interconnect region comprising a plurality of metallization layers, each metallization layer being separated by an insulating layer; and forming a switching device in the interconnect region from the plurality of metallization layers, the switching device comprising an assembly in a cavity of a housing, the assembly comprising a beam held by a structure built into the housing, the beam and the structure being electrically conductive and formed from a same layer of metallization of the plurality of metallization layers, wherein the structure comprises a first plurality of arms disposed on a first side of the beam and a second plurality of arms disposed on a second side of the beam, the first side being opposite to the second side, wherein the beam, the first plurality of arms, and the second plurality of arms are completely formed of metal of the same layer of metallization in which the beam is formed, and wherein a first arm of the first plurality of arms directly contacts the beam at a first location, a second arm of the first plurality of arms directly contacts the beam at a second location, a first arm of the second plurality of arms directly contacts the beam at a third location, and a second arm of the second plurality of arms directly contacts the beam at a fourth location, and each of the first location, the second location, the third location, and the fourth location is a different location of the beam.

10. The method according to claim 9, wherein the structure is X-shaped and substantially symmetrical with respect to the beam, and a major axis of the beam is perpendicular to a respective major axis of each of the first plurality of arms and the second plurality of arms.

11. The method according to claim 9, further comprising:
forming the housing from the plurality of metallization layers, the housing enclosing the cavity; and
forming an opening in a wall of the housing.

12. The method according to claim 11, further comprising removing dielectric material from within the housing to form the cavity, wherein the dielectric material is removed by using an etchant introduced via the opening.

13. The method according to claim 11, further comprising forming a metal plate in the interconnect region proximate to the opening.

14. The method according to claim 13, further comprising forming a conductive trace that passes through the metal plate and the opening and contacts the structure.

15. A method, comprising:
forming a first metal layer over semiconductor substrate;
forming a second metal layer over the first metal layer;
forming a third metal layer over the second metal layer, wherein a plurality of first vias electrically connect first conductive features of the third metal layer to one or more conductive features of the second metal layer, and wherein a switching device is formed by second conductive features of the third metal layer, the switching device comprising an assembly, the assembly comprising a beam held by a structure;
forming a fourth metal layer over the third metal layer, wherein a plurality of second vias electrically connect one or more conductive features of the fourth metal layer to the first conductive features of the third metal layer, and wherein a housing is formed by the one or more conductive features of the second metal layer, the first conductive features of the third metal layer, the one or more conductive features of the fourth metal layer, the plurality of first vias, and the plurality of second vias, wherein the switching device is disposed inside the housing, wherein a section of the housing that is formed by the fourth metal layer comprises one or more openings over the switching device, and wherein the assembly extends from a first sidewall of the housing to a second sidewall of the housing, the first sidewall being opposite to the second sidewall; and
performing an etching process through the one or more openings to remove insulating material inside the housing surrounding the switching device and form a cavity in the housing, the cavity being defined in part by a first conductive feature of the one or more conductive features of the second metal layer, a first via of the plurality of first vias, and a second via of the plurality of first vias, wherein the first conductive feature of the one or more conductive features of the second metal layer extends from the first via of the plurality of first vias to the second via of the plurality of first vias, and wherein the first conductive feature of the one or more conductive features of the second metal layer physically contacts the first via of the plurality of first vias and the second via of the plurality of first vias.

16. The method according to claim 15, further comprising:
depositing an insulating layer over the fourth metal layer, the insulating layer extending into the one or more openings.

17. The method according to claim 15, wherein the etching process comprises an isotropic dry etching process followed by a wet etching process.

18. The method according to claim 17, wherein hydrofluoric acid is used in the wet etching process.

19. The method according to claim 15, wherein the structure is X-shaped and substantially symmetrical with respect to the beam.

20. The method according to claim 15, wherein the structure is stressed in tension in the absence of a potential difference applied to the structure.

* * * * *